United States Patent
Tews et al.

(10) Patent No.: US 6,599,798 B2
(45) Date of Patent: Jul. 29, 2003

(54) METHOD OF PREPARING BURIED LOCOS COLLAR IN TRENCH DRAMS

(75) Inventors: Helmut Tews, Poughkeepsie, NY (US); Stephan Kudelka, Ottendorf-Okvilla (DE); Uwe Schroeder, Dresden-Klotzsche (DE); Rolf Weis, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/910,771

(22) Filed: Jul. 24, 2001

(65) Prior Publication Data

US 2003/0020110 A1 Jan. 30, 2003

(51) Int. Cl.⁷ .......................................... H01L 21/8242
(52) U.S. Cl. ....................... 438/249; 438/243; 438/244; 438/246; 438/386; 438/387; 438/389; 438/392
(58) Field of Search ....................... 438/243, 244, 438/245, 246, 247, 248, 249, 386–392; 257/301

(56) References Cited

U.S. PATENT DOCUMENTS

| | | | | |
|---|---|---|---|---|
| 5,658,816 A | * | 8/1997 | Rajeevakumar | 438/386 |
| 6,008,103 A | * | 12/1999 | Hoepfner | 438/386 |
| 6,100,132 A | * | 8/2000 | Sato et al. | 438/243 |
| 6,110,792 A | * | 8/2000 | Bronner et al. | 438/386 |
| 6,190,988 B1 | * | 2/2001 | Furukawa et al. | 438/386 |
| 6,211,006 B1 | * | 4/2001 | Tsai et al. | 438/246 |
| 6,300,211 B1 | * | 10/2001 | Togo | 438/386 |
| 6,359,300 B1 | * | 3/2002 | Economikos et al. | 257/301 |
| 6,265,485 B1 | * | 4/2002 | Shiao et al. | 438/392 |

FOREIGN PATENT DOCUMENTS

| | | | | |
|---|---|---|---|---|
| EP | 848418 A2 | * | 6/1998 | H01L/21/3205 |
| JP | 2000031408 A | * | 1/2000 | H01L/21/8242 |
| JP | 2000124420 A | * | 4/2000 | H01L/27/108 |
| JP | 2000323684 A | * | 11/2000 | G11C/11/401 |

* cited by examiner

*Primary Examiner*—Richard Booth
*Assistant Examiner*—Jennifer M. Kennedy (57) ABSTRACT

The vertical DRAM capacitor with a buried LOCOS collar characterized by: a self-aligned bottle and gas phase doping; no consumption of silicon at the depth of the buried strap; no reduction of trench diameter; and a nitride layer to protect trench sidewalls during gas phase doping.

11 Claims, 12 Drawing Sheets

FIG. 1

PRIOR ART

METHOD OF PREPARING BURIED LOCOS COLLAR IN TRENCH DRAMS

BACKGROUND OF THE INVENTION

1. Field of the Invention

The present invention relates to preparing a buried LOCOS collar in a trench DRAM by using an integration scheme that: avoids widening of the trench CD (critical dimensions); avoids the presence of a thick collar inside the trench that reduces the available diameter of the trench for trench processing and trench fill; and improves the resistance of an oxide collar to dopant diffusion during gas phase doping.

2. Description of the Prior Art

In the field of making electronic devices, current objectives focus on fitting significantly more active devices in a specific area of a semiconductor substrate. In this effort, reduction of the minimum geometries of the semiconductor device entails a reduction in the spacing between adjacent semiconductor devices, as this aids in increasing the density of the active surface area of a semiconductor substrate. For example, when semiconductor devices are positioned too close to one another on a substrate, parasitic currents and capacitances result that degrade the performance of the circuit. Accordingly, significant effort is focused into designing methods and structures to electrically isolate adjacent semiconductor devices while at the same time permitting the semiconductor devices to be positioned close to one another.

Amongst the isolation techniques used in the past is the local oxidation of silicon (LOCOS) technique. The LOCOS structure resulting from this technique is one where the surface of the active semiconductor is oxidized between the active regions of the semiconductor surface to alleviate electrical interaction between adjacent devices. Nevertheless, the effectiveness of the LOCOS method degrades as the devices become closer due to the fact that parasitic currents develop between adjacent devices beneath the LOCOS structures. These currents are sometimes referred to as "punch-through" currents because they travel through the bulk semiconductor underneath the LOCOS structures.

A further method of isolation of adjacent structures in a semiconductor device is the use of TI (Trench Isolation). In this method, trenches are etched between adjacent active regions of the semiconductor substrate. The deep trenches are effective means of preventing the so called "punch-through" currents. Nevertheless, in placing these trenches in semiconductor devices, leakage problems tend to arise in the devices themselves. That is to say, if the trench is used to isolate a FET (Field Effect Transistor), the performance of the transistor can be degraded due to creation of a conduction path across the channel of the transistor along the trench sidewall. The current path results from leakage along the surface of the trench sidewall. Therefore, although the trench can eliminate the "punch-through" current between adjacent devices, the trench may also degrade performance of the device that it is intended to isolate.

U.S. Pat. No. 6,136,633 discloses a method of forming an improved buried contact junction. The method entails:

providing a gate oxide layer over the surface of a semiconductor substrate;

depositing a first polysilicon layer over the gate oxide layer;

forming a photoresist mask over the first polysilicon layer having an opening over the planned buried contact;

etching the first polysilicon layer not covered by the photoresist mask;

cutting away a portion of the photoresist mask at the edges of the opening to expose a portion of the first polysilicon layer at the edges;

etching the gate oxide layer not covered by the mask wherein the etching has a reduced selectivity of oxide to silicon so that an upper portion of the first polysilicon layer exposed at the edges of the opening is etched away leaving a thinner first polysilicon layer at the edges of the opening;

implanting ions through the opening and through the thinner first polysilicon layer into the semiconductor substrate to form the buried contact;

removing the photoresist mask; and depositing a second polysilicon layer overlying the first polysilicon layer and the buried contact to complete the formation of the buried contact in the fabrication of the integrated circuit device.

A method for making an electrical connection between a trench storage capacitor and an access transistor in a DRAM is disclosed in U.S. Pat. No. 5,827,765. The electrical connection is formed by selectively controlled outdiffusion of a N-type or P-type dopant present in the trench through a single crystalline semiconducting material which is grown by epitaxy (epi) from the trench sidewall. The epitaxially grown single crystalline layer functions as a barrier to excessive dopant outdiffusion that occurs in the processing of conventional DRAMs.

U.S. Pat. No. 6,090,686 discloses a LOCOS isolation process using a layered pad nitride and dry field oxidation stack, as well as a semiconductor device employing the same. The method of manufacturing the isolation structure comprises:

depositing a first isolation stack-nitride sublayer over a substrate at a first deposition rate;

depositing a second isolation stack-nitride sublayer over the first isolation stack-nitride sublayer at a second deposition rate that is different from the first deposition rate; and depositing a third isolation stack-nitride sublayer over the second isolation stack-nitride sublayer at a third deposition rate that is subsequently equal to the first deposition rate.

U.S. Pat. No. 5,350,941 discloses a trench isolation structure having a trench formed in a LOCOS structure and a channel stop region on the sidewalls of the trench. The isolation structure comprises:

a LOCOS structure formed on the outer surface, the LOCOS structure comprising a first bird's beak structure disposed laterally adjacent the first active region and a second bird's beak structure disposed laterally adjacent the second active region;

a trench plug disposed in a trench formed through the LOCOS structure between the first and second bird's beak structures and in the semiconductor layer, the trench comprising sidewalls defining an interface between the trench plug and the semiconductor layer; and a channel stop region located in the sidewalls of the trench.

Figure 1:
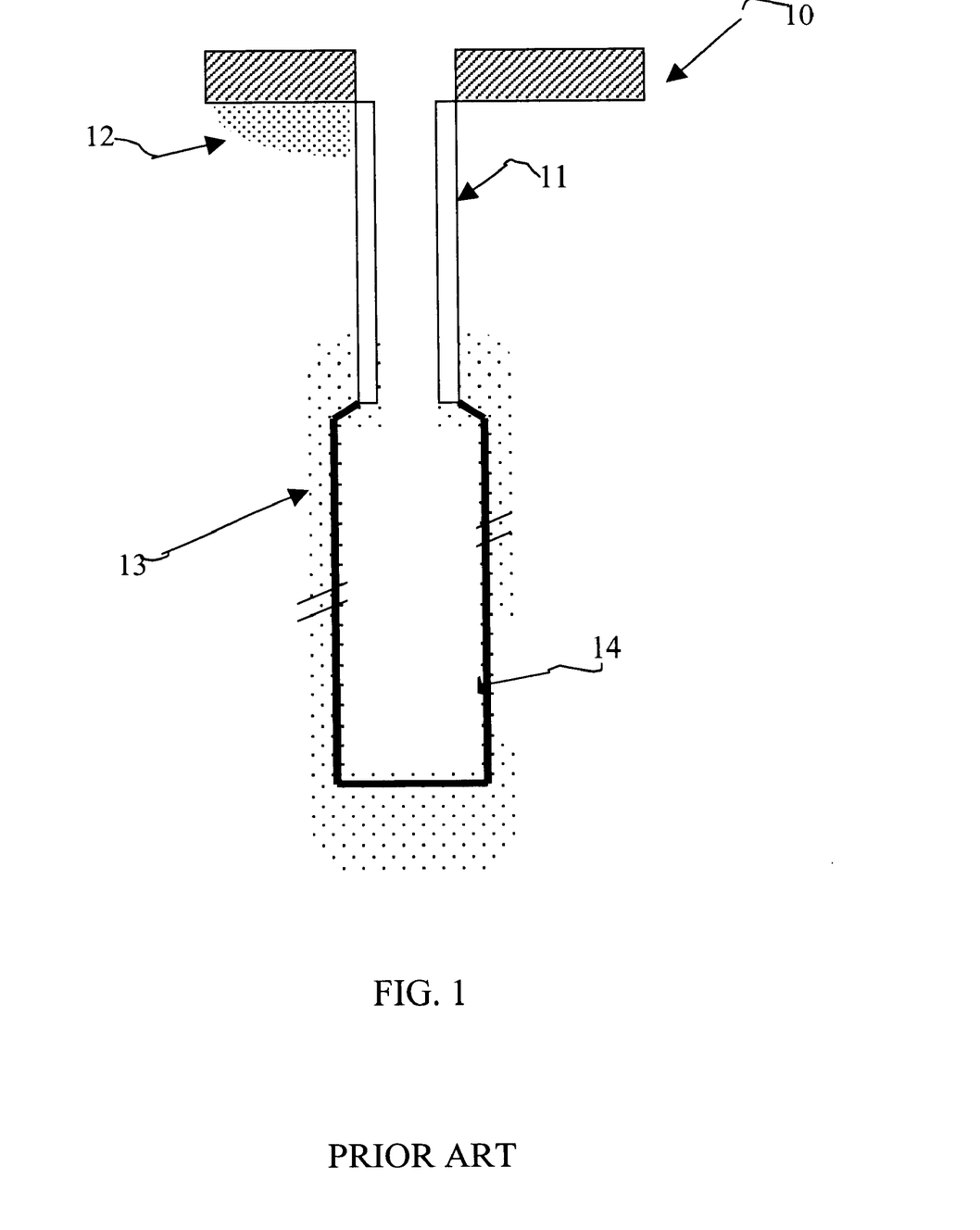

A schematic design of a conventional vertical DRAM capacitor cell after processing the deep trench (DT) etch, buried plate, bottle and collar, resembles that shown in FIG. 1.

In this structure of FIG. 1, there is shown a pad nitride 10, isolation collar 11, contact 12, buried plate 13, and a storage capacitor 14. It can be seen from this figure that there is a reduction of trench diameter after the collar formation in this conventional collar formation scheme.

There is need in the art of preparing buried LOCOS collars in trench DRAMs to provide an integration scheme that: avoids LOCOS oxidation consumption of silicon from the trench side walls; avoids widening of the trench CD (critical dimensions); avoids the presence of a thick collar inside the trench that reduces the available diameter of the trench for trench processing and trench fill; and improves the resistance of the oxide collar to dopant diffusion during gas phase doping.

SUMMARY OF THE INVENTION

One object of the present invention is to provide a process for making a buried LOCOS collar in trench DRAMs that avoids the widening of the trench at the height of the buried strap.

Another object of the present invention is to provide a process for incorporating a buried LOCOS collar in trench DRAMs that avoids the widening of the trench at the height of the buried strap and thereby allows extension of the technology to small groundrules.

A further object of the present invention is to provide a process flow for incorporating a buried LOCOS collar in trench DRAMs that avoids widening of the trench at the height of the buried strap, thereby permitting extension of the technology to small groundrules, as well as avoiding reduction of free trench diameter by virtue of the fact that the collar is placed outside the trench.

A yet further object of the present invention is to provide a process flow for a buried LOCOS collar in trench DRAMs that avoids the presence of a thick collar inside the trench that reduces the available diameter of the trench for trench processing and trench fill.

A still further object of the present invention is to provide a process flow for incorporating a buried LOCOS collar in trench DRAMs that does not suffer from the small resistance of an oxide collar to dopant diffusion during gas phase doping.

In general, using the process flow scheme of preparing a buried LOCOS collar in trench DRAMs of the present invention provides a process and collar characterized by the following advantages:

fabrication of the collar after DT (Deep Trench) etch prior to trench processing;

self-aligned bottle and gas phase doping;

no consumption of silicon at the depth of the buried strap;

no reduction of trench diameter;

a nitride layer to protect trench sidewalls during gas phase doping; and no thermal budget for collar formation after node deposition is needed.

DESCRIPTION OF THE PREFERRED EMBODIMENT

Figure 2:
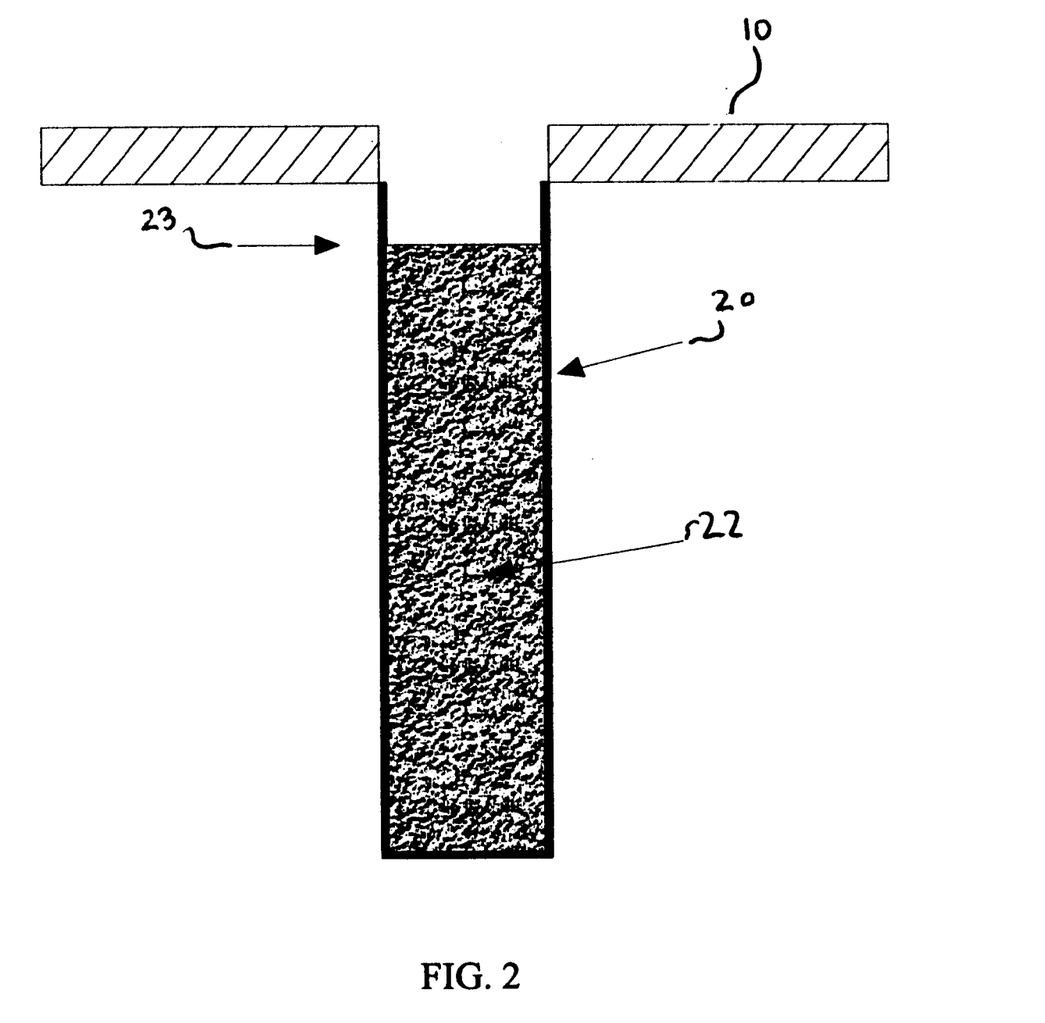

The process flow or integration scheme for providing a buried LOCOS collar in trench DRAMs in the present invention may be best understood by reference to FIG. 2 which shows the DRAMs structure at a stage after a DT etch, deposition of a thin nitride layer 20, for example, by a LPCVD (Low Pressure Chemical vapor Deposition) at about 40A thick. The DT etch is affected through a pad nitride 10, and after deposition of the thin nitride layer 20, trench fill is accomplished with sacrificial polysilicon 22. Thereafter, planarization and poly recess is affected to obtain a depth above the STI (Shallow Trench Isolation) level 23 at about 500 nm.

Figure 3:
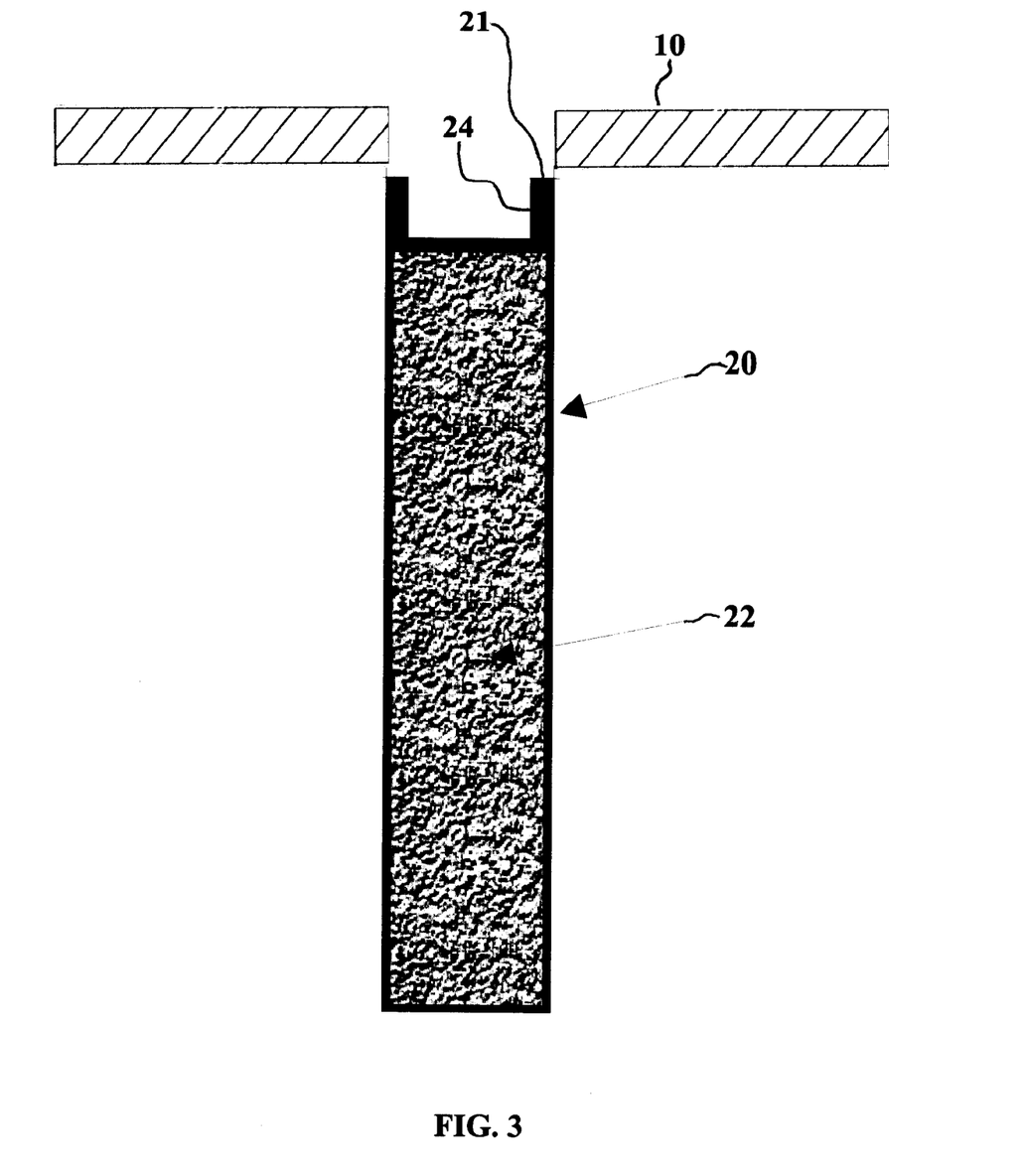

After preparing the structure shown in FIG. 2, the structure of FIG. 3 is formed by deposition of a thin dielectric layer 21 different from the first nitride layer 20. An example of the different layer is a thin oxide layer. This layer is created, i.e., by radical assisted oxidation of the top part of the nitride layer, or by deposition of an oxide layer. The optimal thickness of this layer would range between 30 to about 50A, although other values are possible. This layer serves as a mask layer for later processing.

Following deposition of the thin dielectric layer different from the first nitride layer, deposition of the second thin nitride layer 24 is made, and this deposition may be by LPCVD, of a thickness from about 30 to about 50A. The purpose of this nitride layer is to protect the oxide mask layer during the sacrificial poly strip. However, the second nitride layer is optional, and this step may be skipped if the sac poly strip does not require nitride layer.

Figure 4:
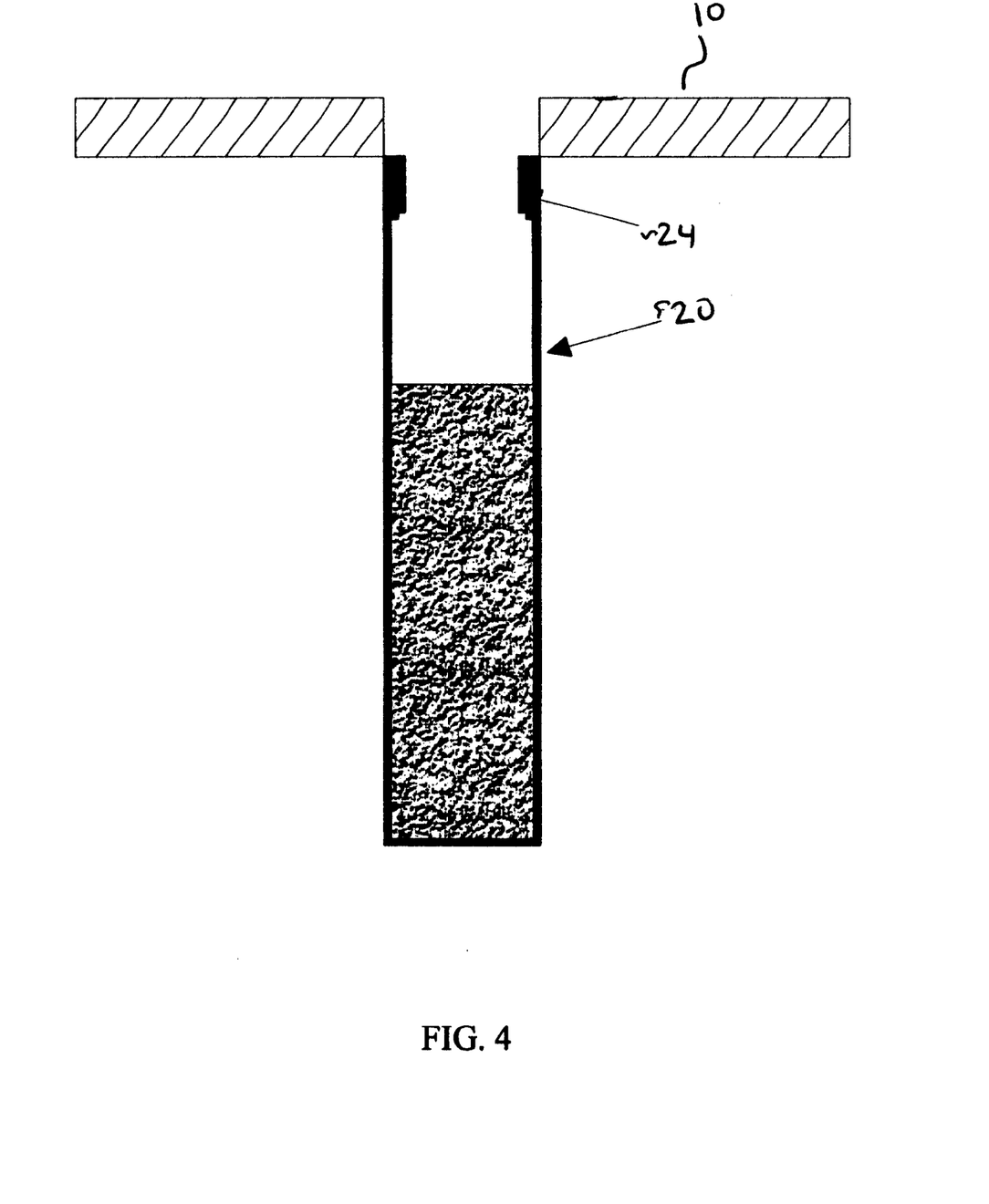

Following the stage of processing shown in FIG. 3, RIE (reactive ion etching) is used to open a step or provide an opening of the nitride/oxide/nitride stack in the trench, as shown in FIG. 4.

Next, a recess of the sacrificial trench poly to a depth that corresponds to the desired lower end of the collar is made, and this recess defines the depth at which the bottle and buried plate are formed in later processing steps.

Figure 5:
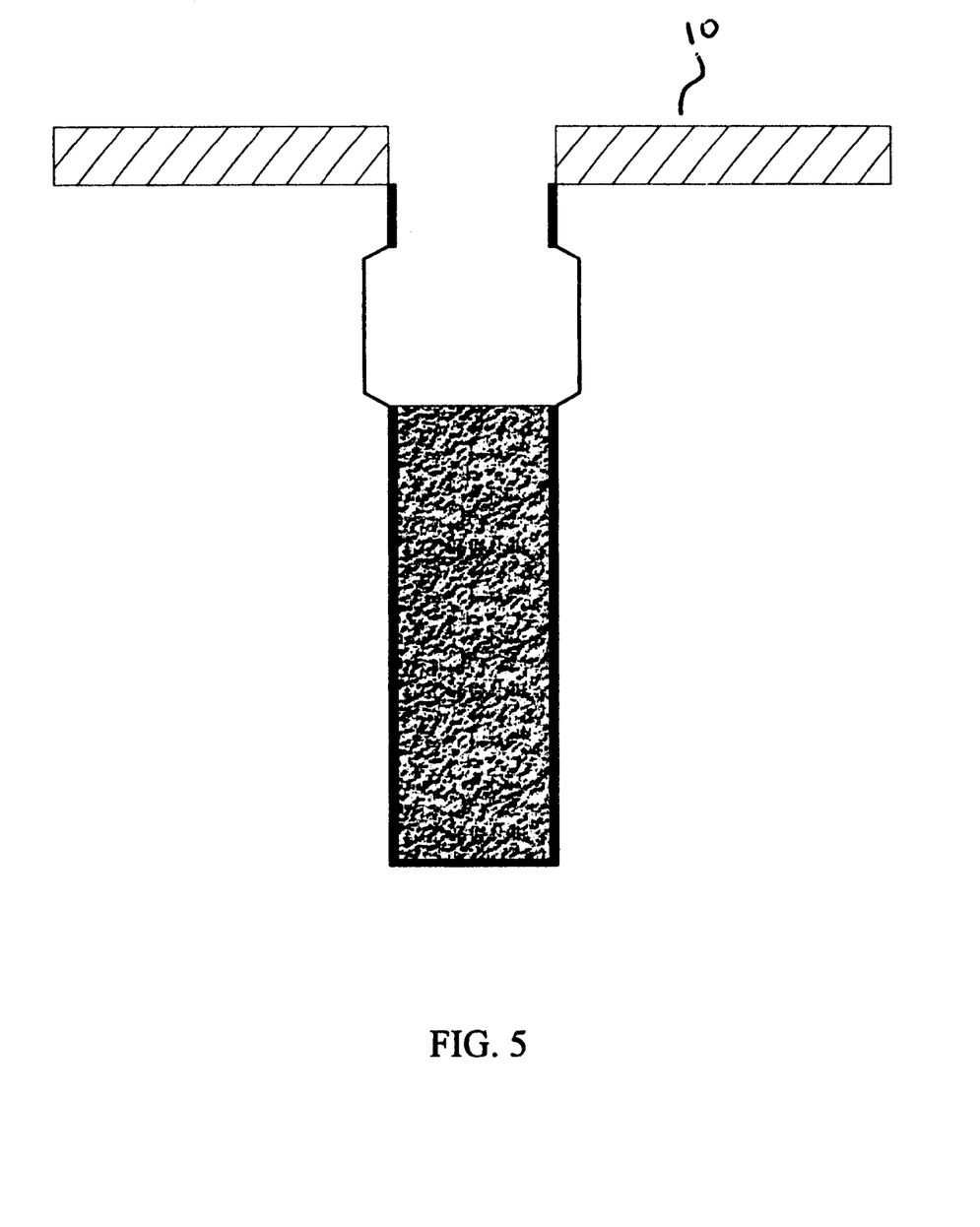

FIG. 5 shows a progression from FIG. 4, wherein there is a nitride etch to remove the nitride layer from the silicon sidewalls in the recessed part of the trench. This etch also removes the top nitride layer from the mask. Thereafter, a silicon etch is performed to:

create a recess sufficiently large such that the collar oxide is placed outside of the trench; and to create a trench shape that allows a uniform LOCOS oxidation.

Figure 6:
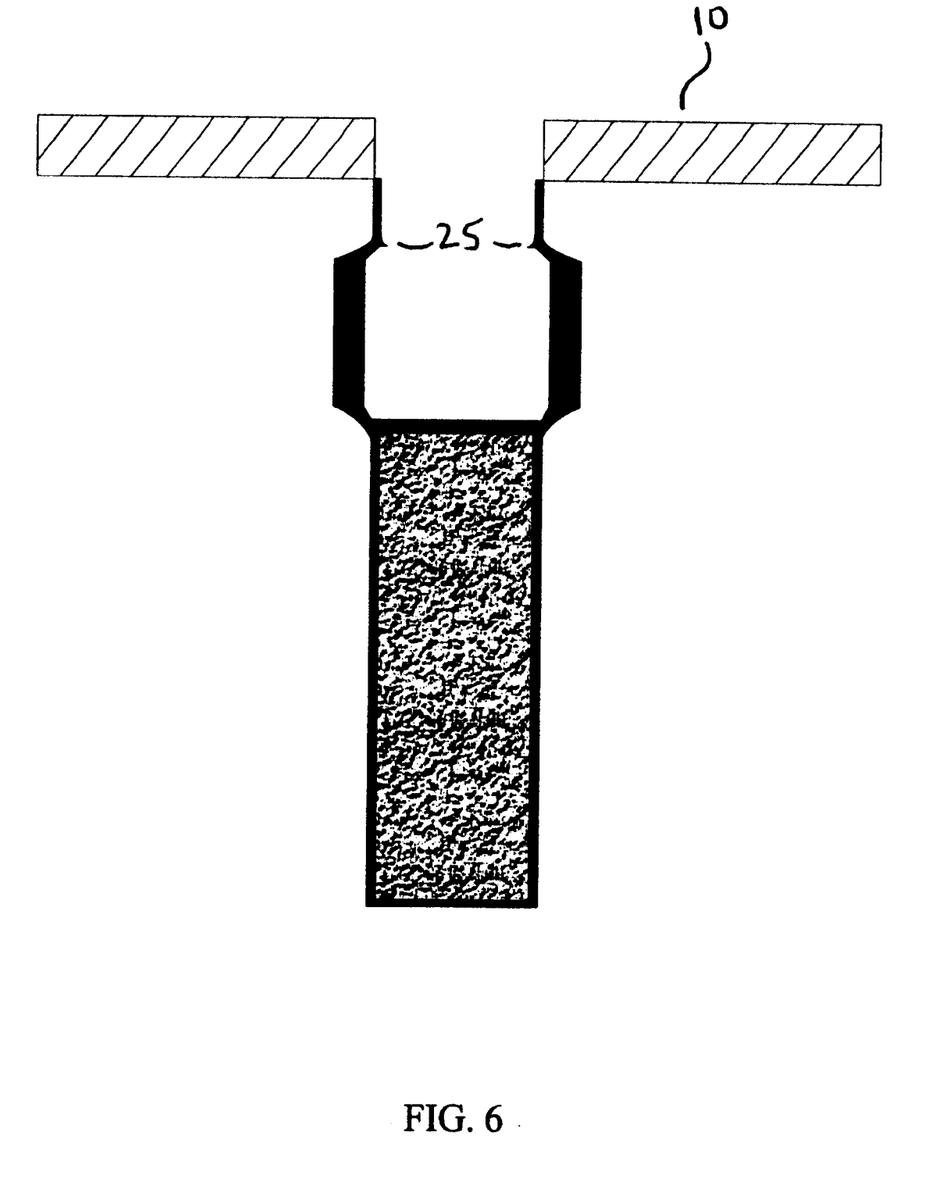

Following the silicon etch, LOCOS oxidation is affected and the oxidation has an upper and lower limit due to the nitride layers, as seen in FIG. 6. At the transition between oxide and nitride, bird's beaks 25 are formed. The LOCOS oxide thickness is chosen such that the vertical parasitic transistor action is suppressed, e.g., to 300A. In the context of the invention, the preferred oxidation process is a thermal oxidation at elevated temperatures, preferably between 1,000 and 1,200° C. to assure good oxide thickness uniformity.

Figure 7:
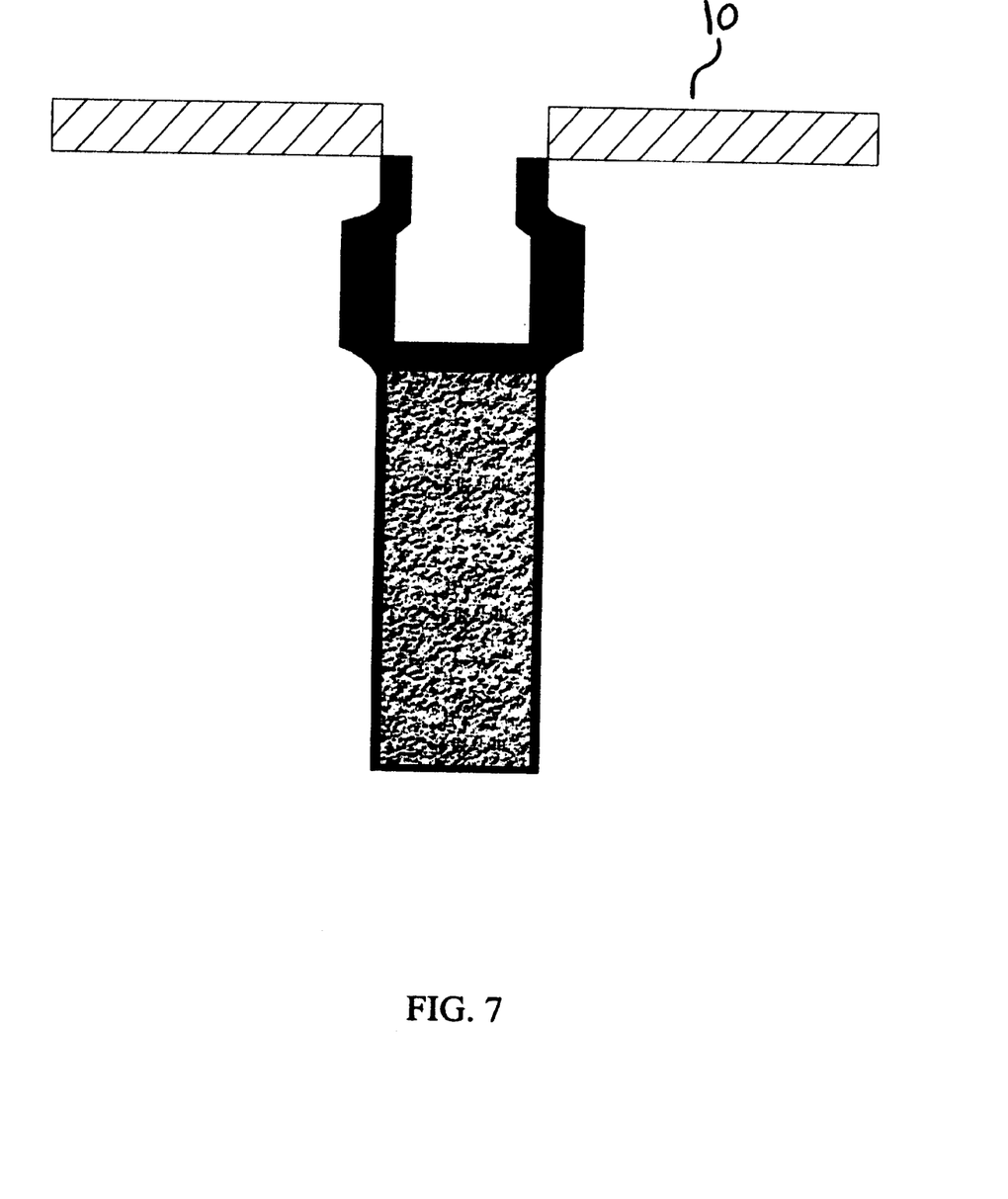

Following the production of the structure of FIG. 6, deposition of a similar mask layer system as that in FIG. 2 (for example, a thin nitride/oxide/nitride was performed) is made. The goal of this layer stack is to provide a nitride layer on top of the LOCOS oxide for gasphase doping, and to protect this nitride layer during the sacrificial poly strip. This structure is shown in FIG. 7.

Figure 8:
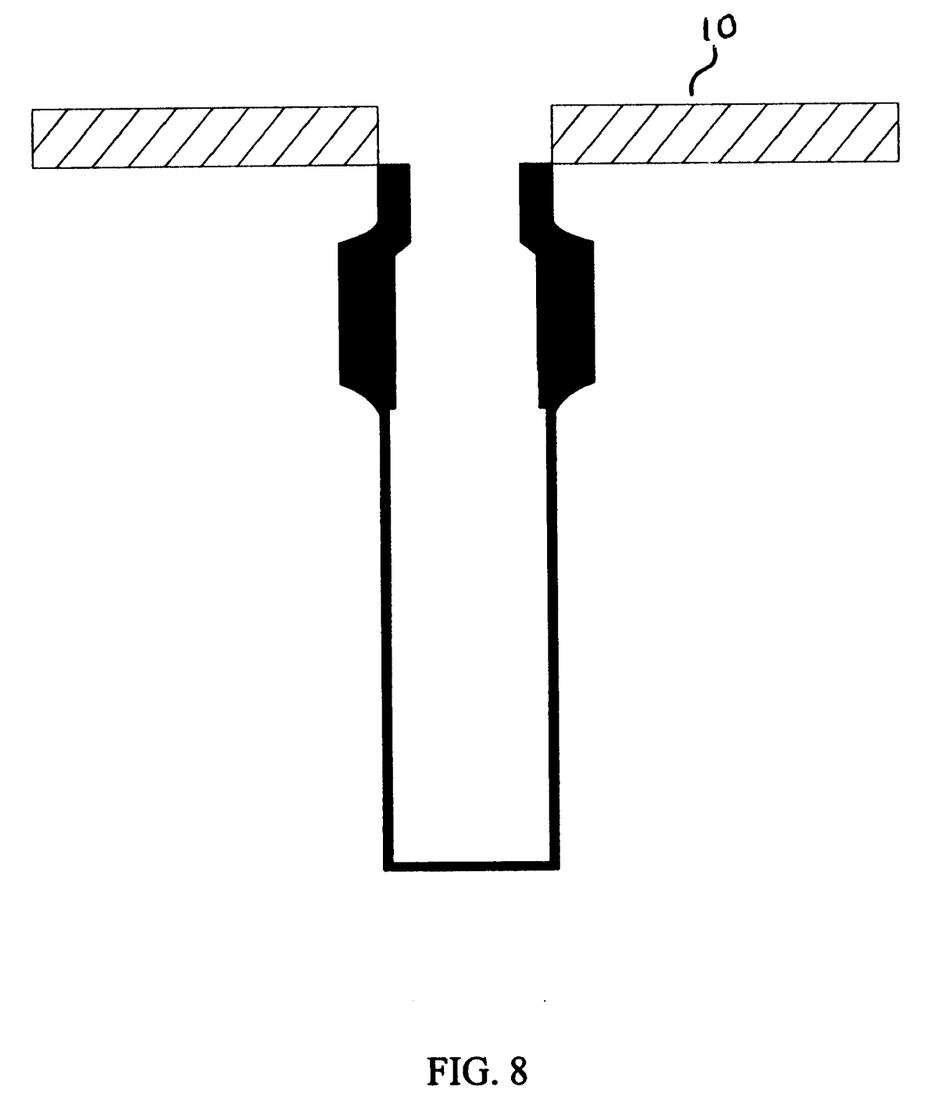
Figure 9:
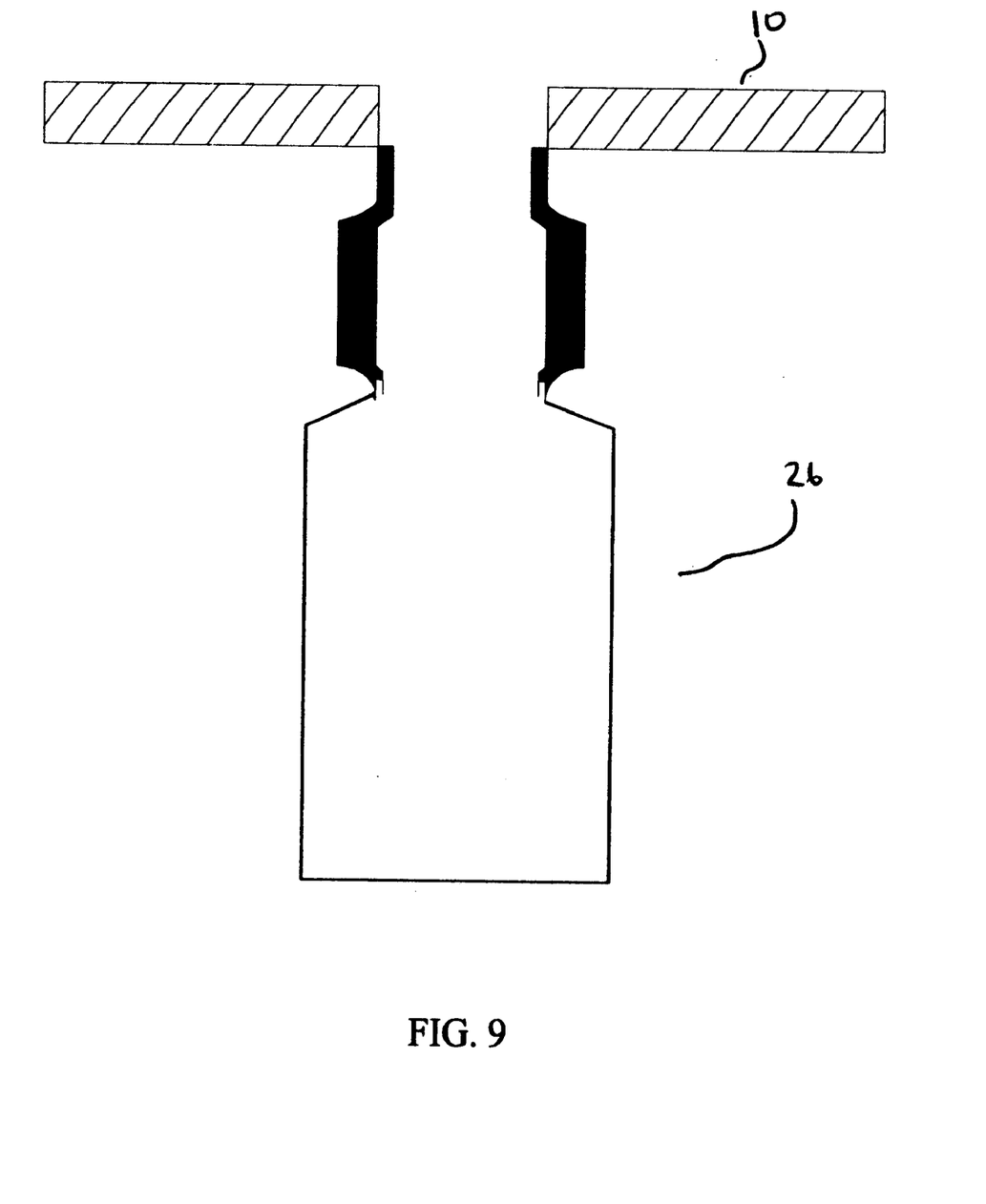
Figure 10:
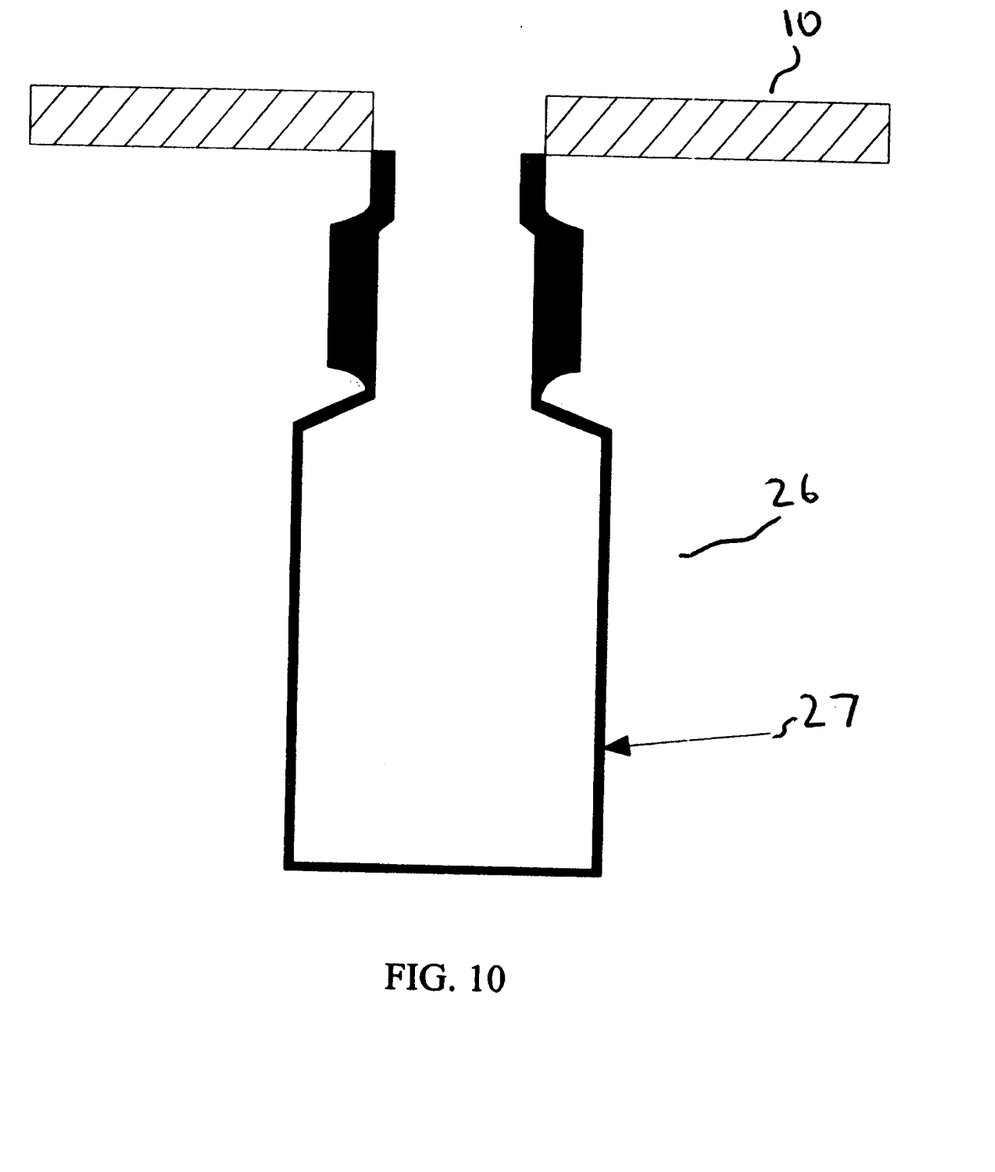

Next, as shown in FIG. 8, a RIE is utilized to provide opening of the nitride/oxide/nitride stack and of the LOCOS oxide at the trench poly. This step is followed by a sacrificial poly strip (which can be done using wet chemistry). The trench sidewalls are protected by the nitride layer. As shown in FIG. 9, the next step is a nitride strip to remove the nitride from the trench sidewall and from the mask. An oxide etch is then performed, and a bottle is formed after a silicide dry or wet etch. This is followed by gasphase doping such that the bottle formation and gasphase doping are self-aligned. During this stage of the process, the buried plate 26 is formed. Next, deposition of a node dielectric layer (i.e., node nitride) is affected as shown in FIG. 10.

Figure 11:
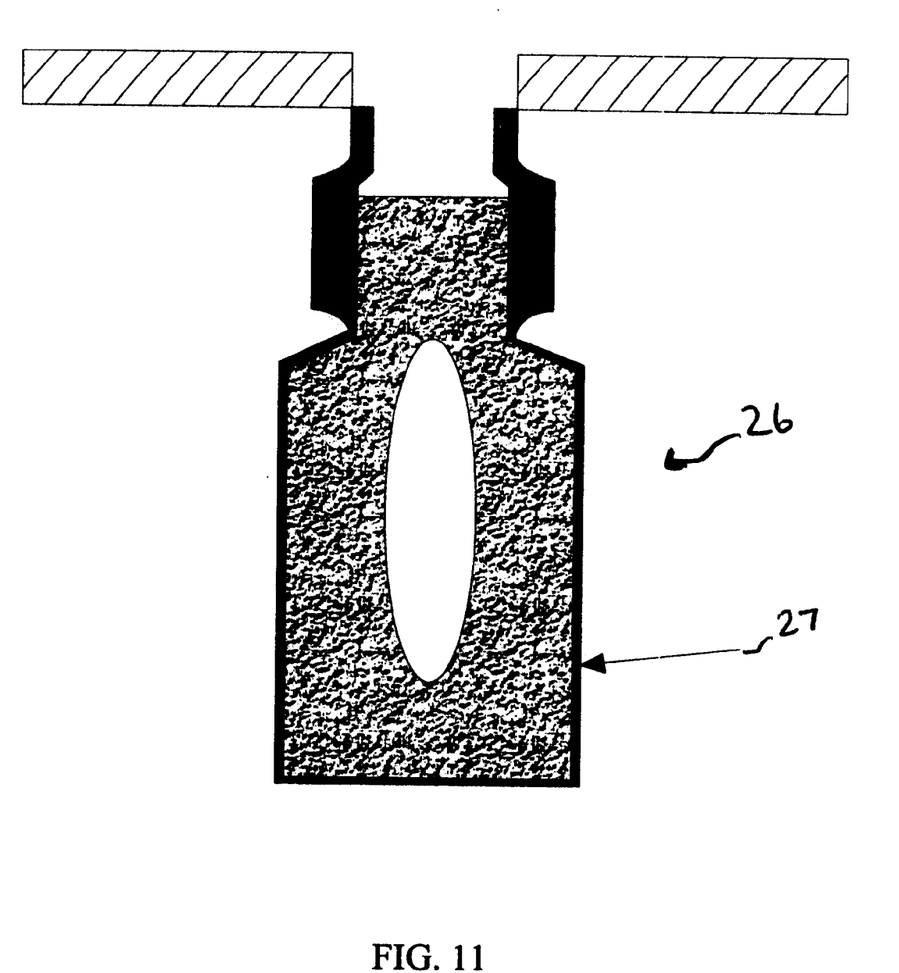

The following describes a process flow for the buried strap formation after buried LOCOS formation. As shown in FIG. 11, a trench polyfill and then a poly recess is performed to arrive at a position of a thick LOCOS oxide.

Figure 12:
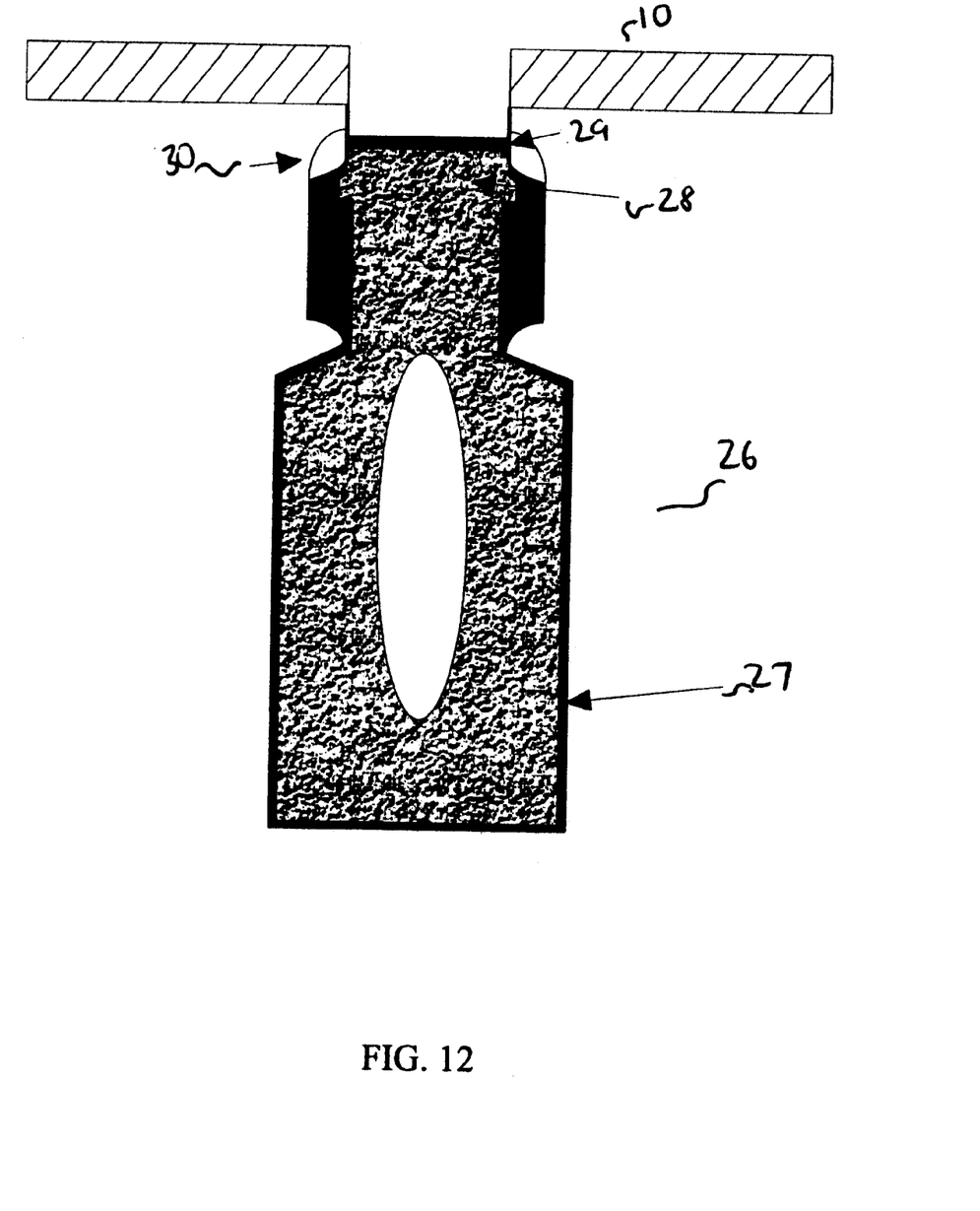

The completed buried LOCOS collar structure of the invention is shown in FIG. 12, and is arrived at by treating the structure shown in FIG. 11 by etch of the node dielectric, performing a nitride from the exposed trench sidewall and affecting buried strap poly deposition 28. A planarization step and recessing is affected to the upper position of the buried trap, after which a TTO (trench top oxide) 29 is deposited. Chemically, the formation of the trench top oxide may be done by thermal oxidation using the selectivity of oxidation between nitrided trench sidewalls and non-nitrided buried trap poly in the trench. optionally, stripping of the thin nitride layer may be performed. This structure also shows the buried trap outdiffusion area 30 from the process. From the structure of FIG. 12, a continuation of conventional processing of the vertical transistor (i.e., gate oxidation, trench fill, etcetera) is completed.

What is claimed is:

1. In a process integration scheme for forming a buried LOCOS collar in a trench vertical DRAM capacitor, the improvement that avoids widening of the trench at the height of the buried strap and avoidance of reduction of free trench diameter by placing the collar outside of the trench, comprising:

a) forming a deep trench (DT) etch in a substrate, depositing a first nitride layer on walls of the deep trench (DT), filling the trench with a sacrificial poly silicon, planarizing and poly recessing to obtain a depth above a later formed STI isolation;

b) depositing a dielectric layer different from said first nitride layer in the trench and depositing a second nitride thereon, thus forming a first nitride/dielectirc layer/second nitride stack;

c) opening the dielectric layer and the second nitride in said trench by a RIE, and recessing the sacrificial trench poly to a depth that corresponds to a desired lower end of the collar and that defines the depth at which the bottle and buried plate are formed in a later processing step;

d) etching to remove the first nitride layer that was exposed during said recessing silicon sidewalls and to remove the second nitride layer from the stack and etching the silicon to:

I) create a recess large enough to place the collar oxide outside the trench; and II. create a trench shape that allows uniform LOCOS oxidation;

e) affecting LOCOS oxidation that has an upper and lower limit due to said first and second nitride layers, and forms bird's beaks between the dielectric layer different from said nitride layer and said second nitride layer, said LOCOS oxide thickness being chosen to suppress vertical transitor action;

f) depositing a second mask layer system of nitride/ second dielectric layer to provide a layer on top of the LOCOS oxide for gas phase doping and to protect said second mask layer system during sacrificial poly strip;

g) affecting RIE to open the nitride/second dielectric stack and the LOCOS oxide at the trench poly and stripping the sacrificial poly while protecting trench sidewalls by the nitride layer;

h) stripping nitride from the trench sidewall and from the mask, affecting on oxide etch, and preparing a bottle formation and gasphase doping such that said bottle formation and gasphase doping are self aligned;

i) depositing a node dielectric layer;

j) affecting a trench poly fill and poly recessing to create a position of a LOCOS oxide; and k) etching the node dielectric, affecting a nitride etch to expose the trench sidewalls, affecting a buried strap nitridation of the silicon walls, affecting a buried strap poly deposition, planarizing and recessing to an upper position of the buried strap, and forming a trench top oxide (TTO).

2. The process of claim 1 wherein in step b), said dielectric layer different from said nitride layers is an oxide layer that serves as a mask for later processing.

3. The process of claim 1 wherein in step b), said dielectric layer different from said first nitride layer is created by radical assisted oxidation.

4. The process of claim 1 wherein said first and second nitride layers are deposited by LPCVD.

5. The process of claim 2 wherein, in step b), a second nitride layer is deposited on said dielectric layer; said second nitride layer serving to protect the oxide mask during sacrificial poly strip.

6. The process of claim 1 wherein, in step d), after the nitride etch the oxide mask is stripped.

7. The process of claim 5 wherein, in step e), said LOCOS oxide thickness that suppresses vertical parasitic transistor action is about 300A.

8. The process of claim 7 wherein said LOCOS oxidation is thermal oxidation at temperatures between about 1000° C. and about 1,200° C. to assure uniform oxide thickness.

9. The process of claim 1 wherein step f), said dielectric second is an oxide layer.

10. The process of claim 9 wherein a RIE is used to open the second mask layer system.

11. The process of claim 10 wherein said node dielectric is a node nitride. and depositing a second nitride thereon, thus forming a first nitride/dielectric layer/second nitride stack the first nitride layer that was exposed during said recessing

* * * * *